(12) United States Patent
Lee et al.

(10) Patent No.: US 9,900,989 B2
(45) Date of Patent: Feb. 20, 2018

(54) PRINTED CIRCUIT BOARD AND METHOD OF MANUFACTURING THE SAME

(71) Applicant: Samsung Electro-Mechanics Co., Ltd., Suwon-si (KR)

(72) Inventors: Yong Jik Lee, Busan (KR); Jung Kyung Sung, Busan (KR); Bong Wan Koo, Changwon-si (KR); Hyun Duck Lim, Busan (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 78 days.

(21) Appl. No.: 14/817,418

(22) Filed: Aug. 4, 2015

(65) Prior Publication Data

US 2016/0037646 A1   Feb. 4, 2016

(30) Foreign Application Priority Data

Aug. 4, 2014  (KR) .................. 10-2014-0099873

(51) Int. Cl.
| | |
|---|---|
| *H05K 1/18* | (2006.01) |
| *H05K 3/46* | (2006.01) |
| *H05K 3/42* | (2006.01) |
| *H01L 23/538* | (2006.01) |

(52) U.S. Cl.
CPC ............ *H05K 1/186* (2013.01); *H05K 3/4602* (2013.01); *H05K 3/4697* (2013.01); *H01L 23/5389* (2013.01); *H01L 2924/0002* (2013.01); *H05K 3/429* (2013.01)

(58) Field of Classification Search
CPC .... H05K 1/186; H05K 3/4602; H05K 3/4697; H05K 3/429; H01L 23/5389; H01L 2924/0002
USPC ............................................ 361/764
See application file for complete search history.

(56) References Cited

U.S. PATENT DOCUMENTS

2008/0296056 A1* 12/2008 Kinoshita ............ H01L 23/13
                                                                  174/261
2009/0098391 A1*  4/2009 Nakagawa ........... H05K 1/036
                                                                  428/433

FOREIGN PATENT DOCUMENTS

KR    10-2013-0044638 A    5/2013

* cited by examiner

*Primary Examiner* — Jenny L Wagner
*Assistant Examiner* — Michael P McFadden
(74) *Attorney, Agent, or Firm* — NSIP Law

(57) ABSTRACT

The object of the present invention is to provide a printed circuit board formed with a cavity to mount a semiconductor chip.

8 Claims, 4 Drawing Sheets

PRINTED CIRCUIT BOARD AND METHOD OF MANUFACTURING THE SAME

CROSS-REFERENCE TO RELATED APPLICATIONS

This application claims the benefit under 35 U.S.C. Section 119(a) of Korean Patent Application Serial No. 10-2014-0099873, filed Aug. 4, 2014, the entire disclosure of which is incorporated herein by reference for all purposes.

BACKGROUND OF THE INVENTION

1. Field of the Invention

The present invention relates to a printed circuit board and a method of manufacturing the same.

2. Description of the Related Art

Recently, circuit boards have been made thinner and miniaturized due to a small form factor of electronic devices, thus high performance in semi-conductor circuit boards and substrates for mainboards are demanded.

According to a demand on designing a large-scale printed circuit board, the pitch length of the printed circuit board has become shorter, and the thickness of the printed circuit board has constantly decreased.

The slimming in the thickness of the prepreg used as an insulation layer when manufacturing a printed circuit board has come to a limit, new methods for sliming the printed circuit board should be found through technological development.

In case of main printed circuit boards used in mobile devices such as smartphones, since a semiconductor chip such as an AP (Application Processor) is bonded on the BGA on the conventional rigid PCB with a SMD (Surface Mounted Device), the thickness of the final products is determined according to the thickness of the practical SMD semiconductor chip.

SUMMARY OF THE INVENTION

The object of the present invention is to provide a printed circuit board that can reduce the overall thickness of the printed circuit board and a method of manufacturing the same, even when mounting relatively thick semiconductor chips like an AP (Application Processor).

In accordance with a primary aspect of the present invention to achieve the object, there is provided a printed circuit board including: a printed circuit board comprising: a core substrate; a first insulation layer that is stacked on the core substrate; a via that is formed on a surface of the first insulation layer and a pad that is formed on a bottom surface of the via; a form maintenance prepreg layer that is stacked on a surface of the insulation layer; and a second insulation layer that is formed on a surface of the form maintenance prepreg layer, wherein a cavity is formed on the form maintenance prepreg layer and the second insulation layer to expose a top surface of the first insulation layer and the via.

Here, the first insulation layer and the second insulation layer can be a prepreg and a protection layer is formed on the surface of the via to prevent from oxidation and contamination.

In accordance with a secondary aspect of the present invention to achieve the object, there is provided a method for manufacturing a printed circuit board including: forming a pad on a surface of the core substrate; stacking a first insulation layer on the surface of the core substrate that is formed with the pad; forming a via by first forming a via hole on the first insulation layer in order to connect to the pad then applying fill plating; removing the fill plating on an area excluding the via; forming an anti-contamination layer on a surface of the via; stacking a form maintenance prepreg layer that has an opening to expose the via on the first insulation layer; stacking a second insulation layer on the form maintenance layer that covers the opening and the form maintenance prepreg layer; forming a cavity by etching and removing the second insulation layer and the form maintenance prepreg layer; and removing the anti-contamination layer.

Here, a release ink or a foam tape may be used for the anti-contamination layer, and a solder resist may additionally be formed to protect the outer circuit layer.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERABLE EMBODIMENTS

Figure 1:
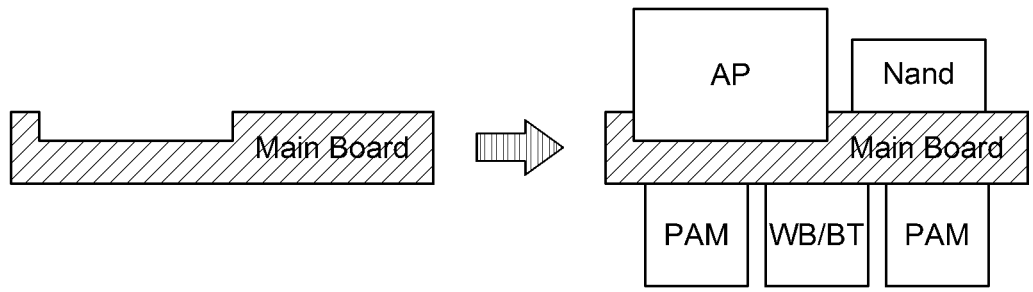
FIG. 1 is a cross-sectional drawing of a printed circuit board of the present invention.

Terms used herein are provided to explain embodiments, not limiting the present invention. Throughout this specification, the singular form includes the plural form unless the context clearly indicates otherwise. When terms "comprises" and/or "comprising" used herein do not preclude existence and addition of another component, step, operation and/or device, in addition to the above-mentioned component, step, operation and/or device.

The objects, specific advantages, and novel features of the present invention will become more apparent from the following detailed description and preferable embodiments when taken in conjunction with the accompanying drawings. In the specification, in adding reference numerals to elements of each drawing, it is to be noted that like reference numerals like elements even through elements are shown in different drawings. Further, in describing the present invention, a detailed description of related well-know techniques will be omitted so as not to obscure the subject of the present invention. In the specification, the terms "first", "second", and so on are used to distinguish between similar elements and do not limit the elements.

Hereinafter, configurations and operational effects of the present invention will be described in detail with reference to the accompanying drawings.

Figure 12:
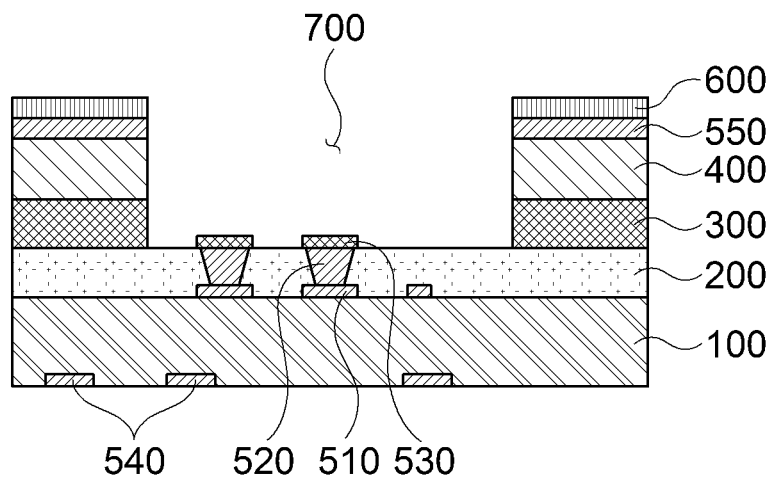
FIG. 12 is a cross-sectional drawing of the printed circuit board after forming a protection layer on a surface of the via in the manufacturing process of the printed circuit board in accordance with an embodiment of the present invention.

FIG. 1 is a cross-sectional drawing of a printed circuit board of the present invention before/after mounting a semi-conductor chip, and FIG. 12 is a cross-sectional drawing of the printed circuit board after forming a protection layer on a surface of the via in the manufacturing process of the printed circuit board in accordance with an embodiment of the present invention.

Referring to FIG. 1, an AP (Application Processor) that has the thickest thickness among the semi-conductor chips is mounted on a printed circuit board formed with a cavity, and since the chip is mounted inside the cavity structure the overall thickness of the printed circuit board can be reduced.

Referring to FIG. 12, the printed circuit board in accordance with an embodiment of the present invention can be formed comprising a first insulation layer 200 stacked on a core substrate 100 with an inner layer circuit 540 formed, a via 520 formed on top of the first insulation layer and a landing pad 510 formed on a bottom surface of the via, a form maintenance prepreg layer 300 stacked on the first insulation layer, a second insulation layer 400 stacked on top of the form maintenance prepreg layer and a cavity 700 formed on the form maintenance prepreg layer and the second insulation layer, and a top surface of the first insulation layer and the via may be exposed in the direction of the cavity.

The core substrate 100 may be an conventional prepreg with a printed circuit pattern formed by conventional methods, and the printed circuit patterns may be formed by etching the copper foils of a CCL (Copper Clad Laminate) that has copper foils formed on both surfaces of the prepreg.

The landing pad 510 is formed on a top surface of the core substrate 100 and formed on an area where the cavity will soon be formed on and is connected with the semi-conductor chip, which will be mounted on the cavity. The material of the landing pad is not limited thereto, however, copper may be conventional considering the conductivity and the cost.

The first insulation layer 200 may be formed by stacking conventional prepreg, the via 520 formed on the landing pad 510 penetrates the first insulation layer, and a top portion is exposed in the direction of the cavity 700 area.

The form maintenance prepreg layer 300 is stacked on top of the first insulation layer on a portion excluding the cavity 700 and 'No Flow' prepreg may be used. The form maintenance prepreg layer can be efficient in a way that can maintain its shape without leaking resin in a high-temperature and a high-pressure process, thus maintaining the form of the cavity and not contaminating the surface of the via.

The second insulation layer 400 can be formed by stacking conventional prepreg, and stacked on top of the form maintenance prepreg layer, and with the form maintenance prepreg layer forms a sidewall of the cavity.

An outer layer circuit 550 may be formed if needed on a top of the second insulation layer, and on top of the outer circuit a solder resist 600 may be formed to protect the outer circuit.

A protection layer 530 may be formed on a top surface of the via 520, this prevents the exposed surface of the via in the direction of the cavity from oxidation or contamination, and can be formed using various method such as OSP (Organic Solderability Preservative), HASL (Hot Air Solder Level), ENIG (Electroless Nickel/Immersion Gold), or ENEPIG (Electroless Nickel/Electroless Palladium/Immersion Gold).

Figure 2:
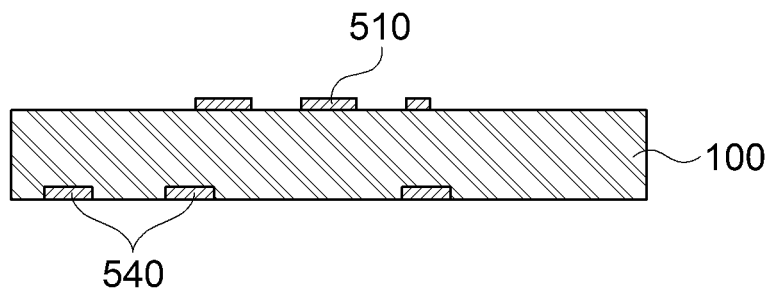
FIG. 2 is a cross-sectional drawing of the printed circuit board after forming a landing pad on a substrate in a manufacturing process of the printed circuit board in accordance with an embodiment of the present invention.
Figure 3:
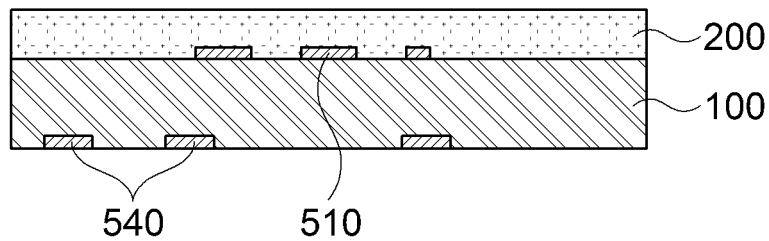
FIG. 3 is a cross-sectional drawing of the printed circuit board after stacking a first insulation layer on the core substrate in the manufacturing process of the printed circuit board in accordance with an embodiment of the present invention.
Figure 4:
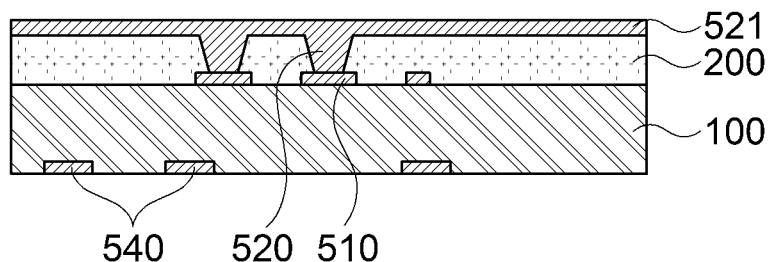
FIG. 4 is a cross-sectional drawing of the printed circuit board after forming a via then a plating in the manufacturing process of the printed circuit board in accordance with an embodiment of the present invention.
Figure 5:
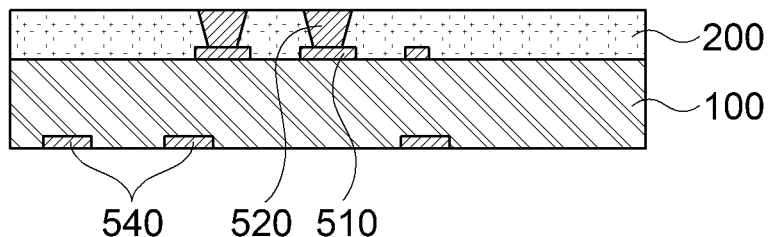
FIG. 5 is a cross-sectional drawing of the printed circuit board after removing a surface plating layer in the manufacturing process of the printed circuit board in accordance with an embodiment of the present invention.
Figure 6:
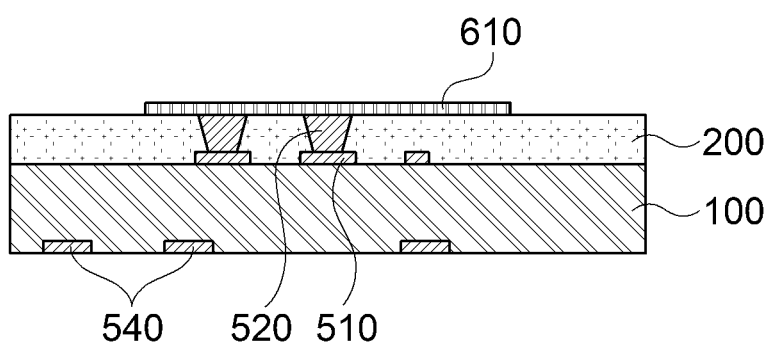
FIG. 6 is a cross-sectional drawing of the printed circuit board after forming an anti-contamination layer in the manufacturing process of the printed circuit board in accordance with an embodiment of the present invention.
Figure 7:
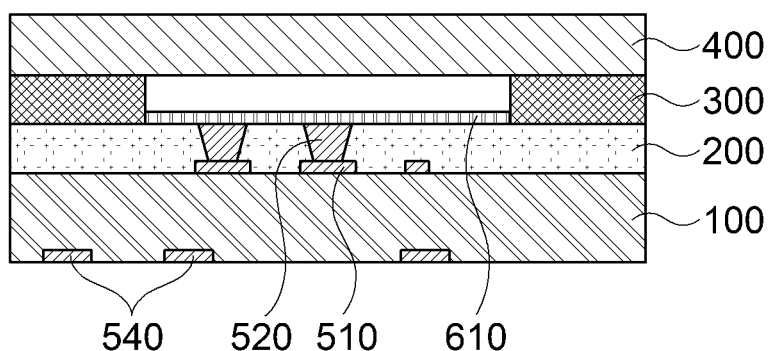
FIG. 7 is a cross-sectional drawing of the printed circuit board after stacking form maintenance prepreg layer and a second insulation layer in the manufacturing process of the printed circuit board in accordance with an embodiment of the present invention.
Figure 8:
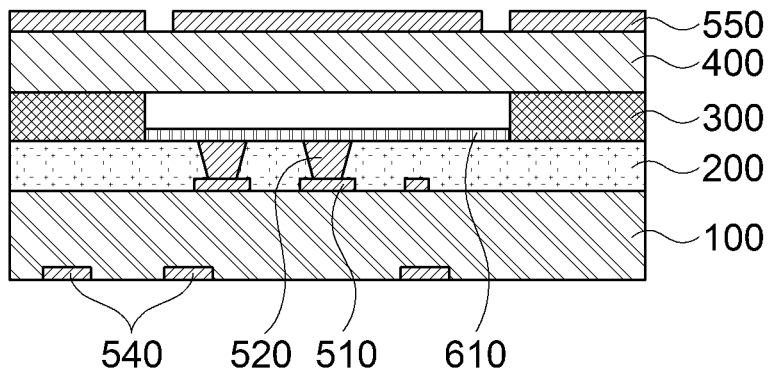
FIG. 8 is a cross-sectional drawing of the printed circuit board after forming outer-layer circuit pattern on a top surface of the second insulation layer in the manufacturing process of the printed circuit board in accordance with an embodiment of the present invention.
Figure 9:
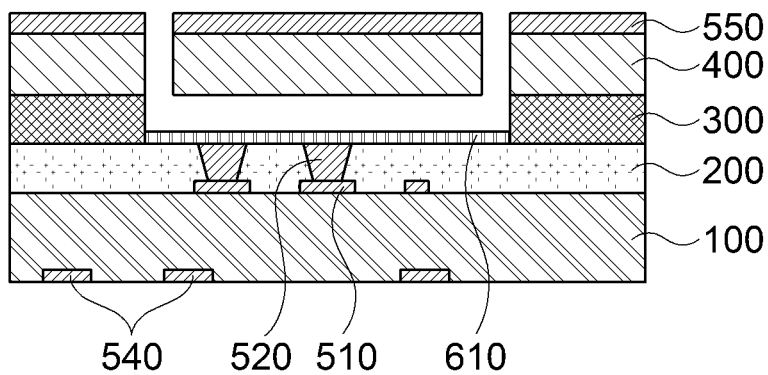
FIG. 9 is a cross-sectional drawing of the printed circuit board after etching the second insulation layer of a cavity area by laser etching in the manufacturing process of the printed circuit board in accordance with an embodiment of the present invention.
Figure 10:
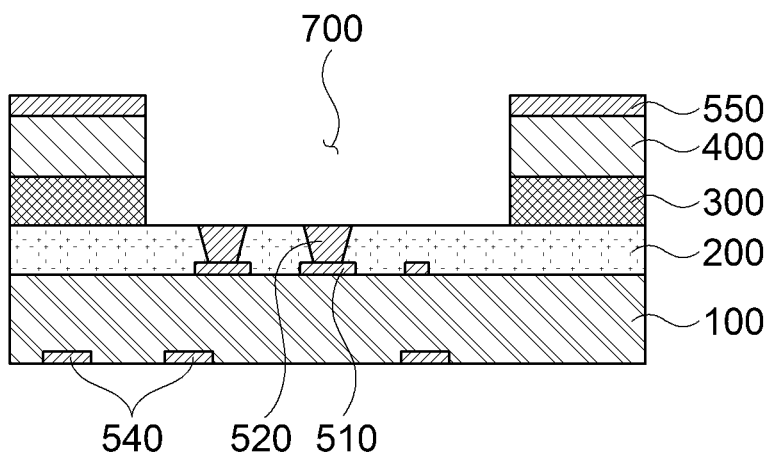
FIG. 10 is a cross-sectional drawing of the printed circuit board after removing the second insulation layer and the anti-contaminant that had been etched by the laser in the manufacturing process of the printed circuit board in accordance with an embodiment of the present invention.
Figure 11:
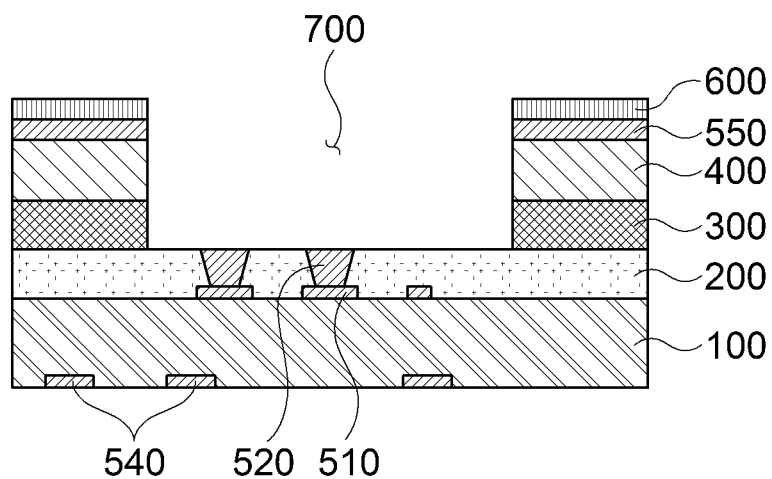
FIG. 11 is a cross-sectional drawing of the printed circuit board after forming a solder resist on a top surface of the outer-layer circuit pattern in the manufacturing process of the printed circuit board in accordance with an embodiment of the present invention.

FIG. 2 is a cross-sectional drawing of the printed circuit board after forming a landing pad on a substrate in a manufacturing process of the printed circuit board in accordance with an embodiment of the present invention, FIG. 3 is a cross-sectional drawing of the printed circuit board after stacking a first insulation layer on the core substrate in the manufacturing process of the printed circuit board in accordance with an embodiment of the present invention, FIG. 4 is a cross-sectional drawing of the printed circuit board after forming a via then processing a fill plating in the manufacturing process of the printed circuit board in accordance with an embodiment of the present invention, FIG. 5 is a cross-sectional drawing of the printed circuit board after removing a surface plating layer in the manufacturing process of the printed circuit board in accordance with an embodiment of the present invention, FIG. 6 is a cross-sectional drawing of the printed circuit board after forming an anti-contamination layer in the manufacturing process of the printed circuit board in accordance with an embodiment of the present invention, FIG. 7 is a cross-sectional drawing of the printed circuit board after stacking form maintenance prepreg layer and a second insulation layer in the manufacturing process of the printed circuit board in accordance with an embodiment of the present invention, FIG. 8 is a cross-sectional drawing of the printed circuit board after forming outer-layer circuit pattern on a top surface of the second insulation layer in the manufacturing process of the printed circuit board in accordance with an embodiment of the present invention, FIG. 9 is a cross-sectional drawing of the printed circuit board after etching the second insulation layer of a cavity area by laser etching in the manufacturing process of the printed circuit board in accordance with an embodiment of the present invention, FIG. 10 is a cross-sectional drawing of the printed circuit board after removing the second insulation layer and the anti-contaminant that had been etched by the laser in the manufacturing process of the printed circuit board in accordance with an embodiment of the present invention, FIG. 11 is a cross-sectional drawing of the printed circuit board after forming a solder resist on a top surface of the outer-layer circuit pattern in the manufacturing process of the printed circuit board in accordance with an embodiment of the present invention, and FIG. 12 is a cross-sectional drawing of the printed circuit board after forming a protection layer on a surface of the via in the manufacturing process of the printed circuit board in accordance with an embodiment of the present invention.

Referring to FIG. 2, the landing pad 510 is formed on a surface of the core substrate 100 equipped with the inner layer circuit pattern 540. Here, etching process after plating or a screen printing method may be used, however it is not limited thereto.

Referring to FIG. 3, the first insulation layer 200 may be formed by stacking prepreg on the surface of the core substrate 100 formed with the landing pad 510. Here, a compressing method that applies heat and pressure may be used, but it is not limited thereto.

Referring to FIG. 4, the via 520 may be formed by forming a via hole on the stacked first insulation layer 200 and processing fill plating. Here, usually the via hole may be formed using a $CO_2$ laser, but other methods that can be used in processing a via hole may be used such as drilling or YAG laser.

Referring to FIG. 5, among the plating layer formed during fill plating the excess plating layer 521 that doesn't fill the via hole can be removed by an etching process.

Referring to FIG. 6, an anti-contamination layer 610 is formed on an opening of the via 520 to prevent the opening surface from oxidation or contamination. Here, the anti-contamination layer 610 can be formed by applying a release ink or attaching a foam tape. The release ink can be a liquid type ink of an etching resist such as a dry film and can form the anti-contamination layer 610 by spraying with a screen printing method and drying. Also, the foam tape can be any tape such as an ordinary adhesive tape, but has foam cells in the adhesive and when heated, the cells are inflated enabling to attach and detach the adhesive.

Referring to FIG. 7, the form maintenance prepreg layer 300 is stacked on an area excluding the cavity 700 area that will soon be mounted with the semiconductor chip (not shown), the second insulation layer 400 is stacked on a top surface of the form maintenance prepreg layer, and the second insulation layer can be any conventional prepreg. Here, the form maintenance prepreg should maintain its shape without leaking resin in any heat or pressure condition of the printed circuit board manufacturing process; 'No Flow' prepreg may be used. Thus, the resin doesn't flow into the cavity 700 in the process of stacking the second insulation layer enabling to form the cavity 700 in precise measures and prevent from contamination of the via surface from the flowing resin.

Referring to FIG. 8, an outer circuit layer 550 can be formed by patterning after processing an outer layer plating on the surface of the second insulation layer.

Referring to FIG. 9, the second insulation layer 400 and the outer circuit layer 550 on the cavity 700 that will soon be mounted with the semiconductor chip is removed. Here, like stated above, commonly $CO_2$ laser is used, but other methods such as drilling or YAG laser can also be used.

Referring to FIG. 10, the anti-contamination layer 610 formed on the surface of the via 520 is removed. If the anti-contamination layer 610 is formed with a release ink, it can be removed with sodium hydroxide similar to removing ordinary dry film. If the anti-contamination layer 610 is formed with foam tape, the tape can be heated to inflate the foam cells inside the foam tape and removed.

Referring to FIG. 11, a solder resist layer 6610 can be applied to protect the outer circuit layer 550.

Referring to FIG. 12, a protection layer 530 is formed to protect the opening of the surface of the via 520 of which the anti-contamination layer has been removed. Here, the protection layer 530 prevents the exposed surface of the via 520 in the direction of the cavity from oxidation or contamination, and can be formed using various surface treatment methods such as OSP (Organic Solderability Preservative), HASL (Hot Air Solder Level), ENIG (Electroless Nickel/Immersion Gold), or ENEPIG (Electroless Nickel/Electroless Palladium/Immersion Gold)

In this way, in the printed circuit board 10 in accordance with an embodiment of the present invention, the thick semiconductor chip can be mounted on the cavity 700 thus contributing to lessen the overall thickness of a mobile device, and also increasing the productivity by skipping the application of solder resist that protects the pad inside the cavity 700.

In the printed circuit board in accordance with the present invention, the overall thickness of the printed circuit board package may be reduced by a method that mounts the relatively thick semiconductor chip in the cavity formed in the printed circuit board.

Also, the prepreg used as the insulation layer replaces the function of the solder resist thus the productivity can be increased due to skipping of additional process of applying, exposing, and developing the solder resist.

The foregoing description illustrates the present invention. Additionally, the foregoing description shows and explains only the preferred embodiments of the present invention, but it is to be understood that the present invention is capable of use in various other combinations, modifications, and environments and is capable of changes and modifications within the scope of the inventive concept as expressed herein, commensurate with the above teachings and/or the skill or knowledge of the related art. The embodiments described hereinabove are further intended to explain best modes known of practicing the invention and to enable others skilled in the art to utilize the invention in such, or other, embodiments and with the various modifications required by the particular applications or uses of the invention. Accordingly, the description is not intended to limit the invention to the form disclosed herein. Also, it is intended that the appended claims be construed to include alternative embodiments.

What is claimed is:
1. A printed circuit board comprising:
a core substrate;
a first insulation layer stacked on the core substrate and formed with a circuit layer including a via and a pad;
a prepreg layer stacked on a surface of the first insulation layer;
a second insulation layer formed on a surface of the prepreg layer; and
an outer layer circuit layer formed on the second insulation layer,
wherein the second insulation layer and the prepreg layer are different materials from each other,
wherein the prepreg layer and the second insulation layer integrally form an insulation layer such that no other circuit layer is formed between the circuit layer of the first insulation layer and the outer layer circuit layer, and wherein a cavity penetrating the prepreg layer and the second insulation layer and using the first insulation layer as a bottom surface thereof is formed.

2. The printed circuit board according to claim 1, wherein the first insulation layer and the second insulation layer are each a prepreg, and the prepreg layer has a lower flowability than the first insulation layer and the second insulation layer.

3. The printed circuit board according to claim 1, wherein the via is exposed to the cavity and has a protection layer formed on a surface thereof.

4. The printed circuit board according to claim 1, wherein a semiconductor chip is mounted on the cavity.

5. The printed circuit board according to claim 1, wherein the printed circuit board additionally includes an outer conductive pattern on the second insulation layer and a solder resist that is formed on the outer conductive pattern.

6. A printed circuit board that equips a cavity for mounting a semiconductor chip, wherein the printed circuit board comprises a core layer and a build-up layer, wherein the core layer comprises a core substrate, a first insulation layer stacked on a surface of the core substrate, and a circuit layer including a via and a pad and formed on the first insulation layer, wherein the build-up layer comprises a prepreg layer, a second insulation layer formed on the prepreg layer, and an outer layer circuit layer formed on the second insulation layer, wherein the second insulation layer and the prepreg layer are different materials from each other, wherein the prepreg layer and the second insulation layer integrally form an insulation layer such that no other circuit layer is formed between the circuit layer of the first insulation layer and the outer layer circuit layer, and wherein the cavity penetrating the prepreg layer and the second insulation layer and using the first insulation layer as a bottom surface thereof is formed.

7. The printed circuit board according to claim 6, wherein the first insulation layer and the second insulation layer are each a prepreg, and the prepreg layer has a lower flowability than the first insulation layer and the second insulation layer.

8. The printed circuit board according to claim 6, wherein the via is exposed to the cavity and has a protection layer formed on a surface thereof.

* * * * *